United States Patent [19]

Shreve

[11] 4,144,507
[45] Mar. 13, 1979

[54] SURFACE ACOUSTIC WAVE RESONATOR INCORPORATING COUPLING TRANSDUCER INTO REFLECTING ARRAYS

[75] Inventor: William R. Shreve, Dallas, Tex.

[73] Assignee: Texas Instruments Incorporated, Dallas, Tex.

[21] Appl. No.: 727,741

[22] Filed: Sep. 29, 1976

[51] Int. Cl.² .................... H03H 9/02; H03H 9/26; H03H 9/32; H03H 9/04
[52] U.S. Cl. .................................. 333/191; 333/153; 333/195
[58] Field of Search .................... 333/30 R, 72, 71; 310/8-8.3, 9.7, 9.8; 235/181; 331/107 A; 330/5.5, 174

[56] References Cited

U.S. PATENT DOCUMENTS

| 3,886,504 | 5/1975 | Hartmann et al. | 333/72 |
| 3,961,293 | 6/1976 | Hartmann et al. | 333/72 |
| 3,970,970 | 7/1976 | Worley | 333/72 |
| 4,013,983 | 3/1977 | Hartemann | 333/72 |
| 4,054,851 | 10/1977 | Borner et al. | 333/72 |

FOREIGN PATENT DOCUMENTS 2363701 6/1975 Fed. Rep. of Germany ............ 333/72

Primary Examiner—Alfred E. Smith
Assistant Examiner—Marvin Nussbaum
Attorney, Agent, or Firm—James T. Comfort; Rene' E. Grossman; William E. Hiller

[57] ABSTRACT

Acoustic surface wave resonator structure in which coupling transducers are incorporated within reflecting arrays. Heretofore, acoustic surface wave resonator devices have included one or more interdigital transducers disposed in the resonant cavity between spaced arrays of reflectors in order to couple energy in and out of the device at resonance. The device disclosed incorporates the interdigital transducers into the reflector arrays themselves, rather than placing the transducers in the resonant cavity, thus allowing a total cavity size less than the total size of the transducers. The electrodes of the interdigital transducers incorporated into the reflector arrays are so arranged as to make these electrodes a periodic extension of the array.

22 Claims, 7 Drawing Figures

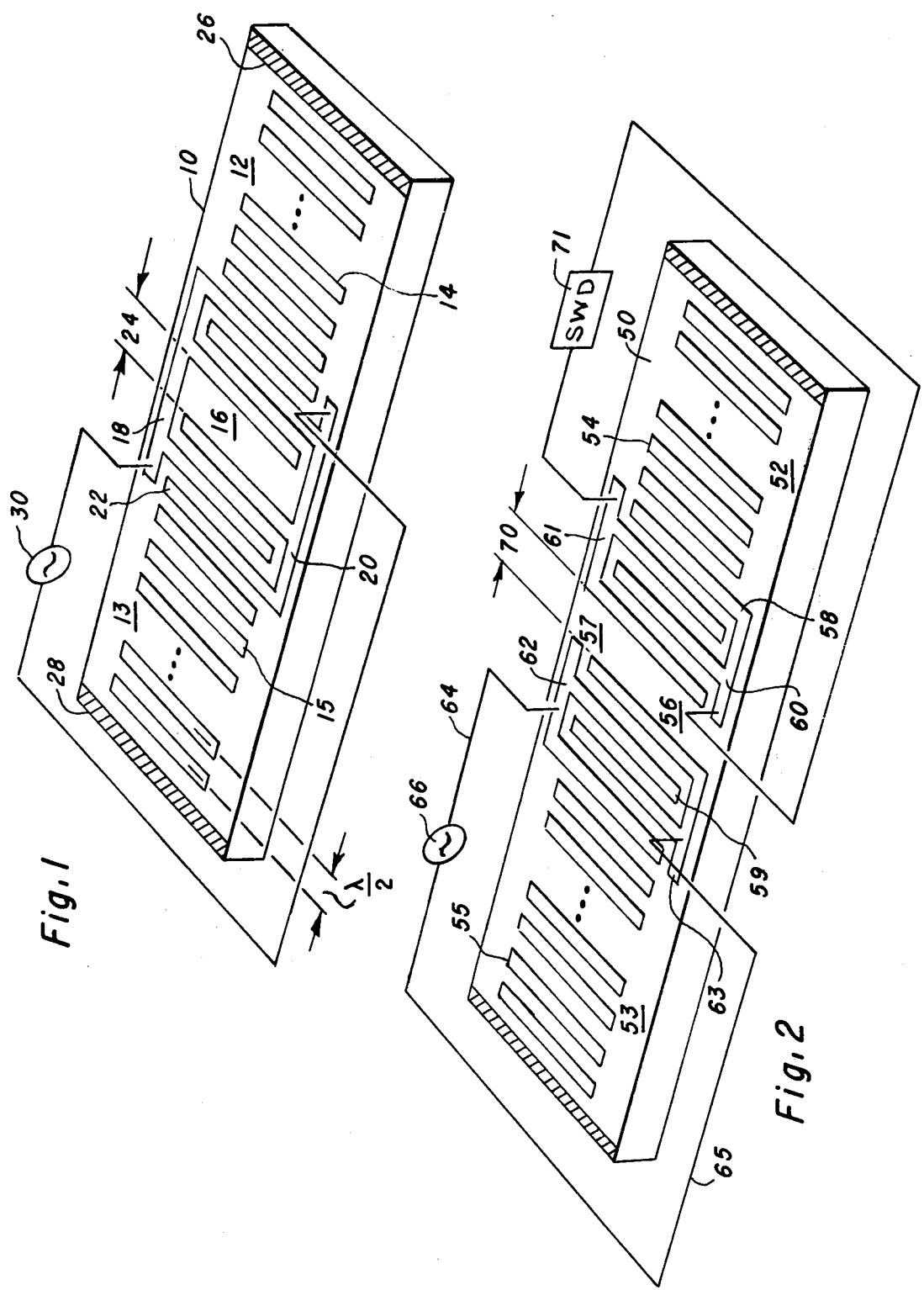

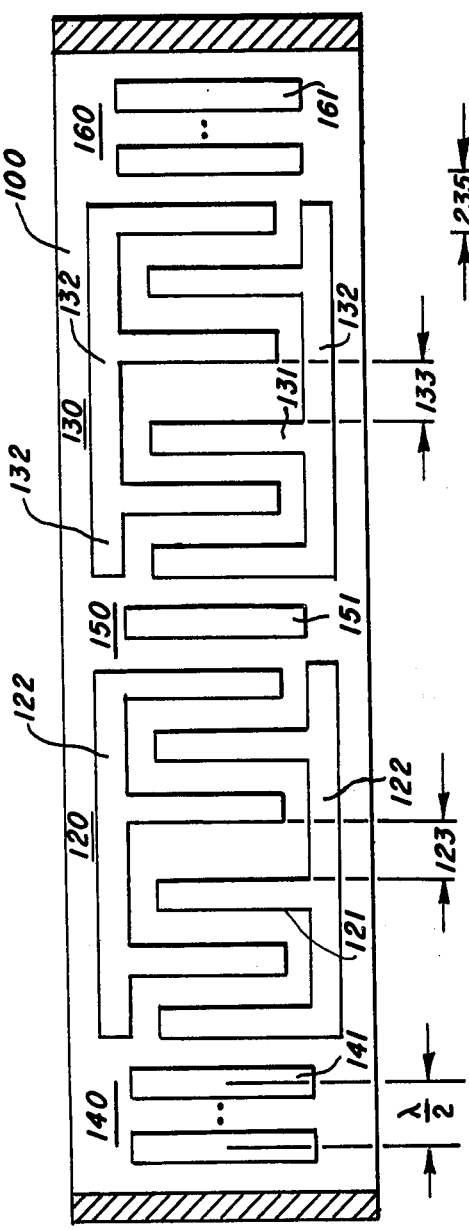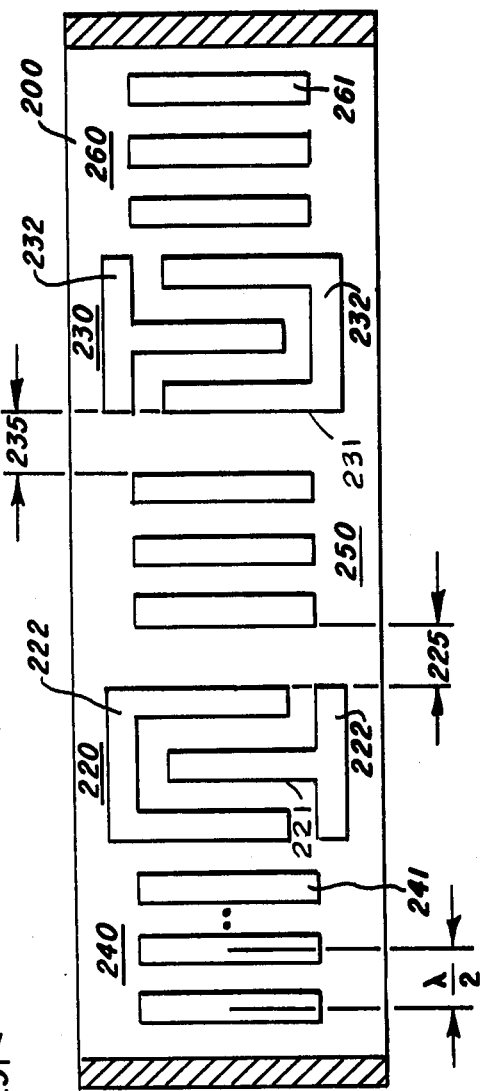

4,144,507

SURFACE ACOUSTIC WAVE RESONATOR INCORPORATING COUPLING TRANSDUCER INTO REFLECTING ARRAYS

BACKGROUND OF THE INVENTION

This invention relates to acoustic surface wave resonator devices and more particularly to resonator devices having interdigital transducers incorporated within reflecting arrays.

There are many applications in communications and other electronic equipment for filters possessing a very narrow frequency response, i.e., bandpass filters or oscillator frequency control elements. Depending upon the specific application in the frequency range under consideration, there are available various approaches to the meeting of the filtering requirement. One approach frequently used is the use of a crystal resonator employing a quartz crystal. Unfortunately, the size of crystal resonators for use in the VHF and UHF bands is such that fabrication becomes extremely difficult.

It has been discovered recently that such desirable frequency responses can be realized conveniently with a surface wave device. Briefly, this device comprises a substrate of piezoelectric material such as quartz, lithium niobate, zinc oxide, or cadmium sulfide, or thin films or piezoelectric material on a non-piezoelectric substrate such as zinc oxide on silicon. Formed thereon are input and output transducers for the purpose of converting input electrical energy to acoustic energy within the substrate and reconverting the acoustic energy to an electric output signal. The input and output transducers frequently comprise interdigital transducers including respective pluralities of interdigitated electrode fingers which extend from pairs of transducer pads. Interdigital transducers are typically formed by depositing a thin film of electrically conductive material such as aluminum or gold on a substrate of piezoelectric material and patterning the thin film into an appropriate structure. Electrical potential is coupled to the input interdigital transducers inducing mechanical stresses in the piezoelectric substrate. The resultant strains propagate along the surface of the substrate away from the input interdigital transducer in the form of surface waves, such as the well known Rayleigh waves or Love waves. These propagating surface waves arrive at a second output interdigital transducer whereby they are converted to output electrical signals. A frequency response characteristic is associated with either the conversion of electrical to acoustical energy by the input interdigital transducer or with the conversion of acoustical to electrical energy by the output interdigital transducer. The nature of these frequency response characteristics is determined by the specific configuration of the transducers themselves. Thus, it is possible to configure the frequency response of the overall device by proper design of the input and output interdigital transducers.

Besides relay line devices, a further use of the surface wave technology has been in the form of high Q resonators functionally analogous to the quartz crystal resonators. The resonance condition occurs in these devices when the input and output interdigital transducers are placed on a substrate in a cavity defined by reflective grating structures located at opposite ends of the substrate. The acoustic surface waves propagating past the output transducer are reflected off the grating structures back toward the input transducer giving rise to standing wave patterns within the cavity. The standing wave condition occurs at a set of discrete frequencies. The frequencies allowing this condition are called the modes of the device. The distance between reflective grating structures determines the frequencies of the modes of the device which will be excited. For two-port resonators, away from resonance the device behaves essentially like a standard delay line device. At resonance, however, the two transducers become tightly coupled and transmission is greatly enhanced over a very narrow frequency range, in the manner of a narrow band transmission filter. An acoustic surface wave device of the type described to this point is disclosed in U.S. Pat. No. 3,886,504 issued May 27, 1975 and in pending U.S. patent application Ser. No. 546,358 filed Feb. 3, 1975.

To be most effectively utilized in oscillators, filters or other applications these devices must support a single resonant mode. This condition sets an upper limit on the physical size of the resonant cavity, since the spacing of mode frequencies is inversely proportional to cavity size. Therefore, a large physical cavity will cause more than one mode frequency to fall within the reflection band of the reflectors and lead to an undesirable multimode resonant response.

For use in bandpass filters without external coupling elements, the cavity size also sets a limit on the maximum achievable bandwidth. This maximum bandwidth is inversely proportional to the effective cavity size. The effective cavity size is equal to the physical cavity size plus an additional length set by the reflectors. Thus, to maximize bandwidth and minimize external coupling elements for any particular reflector design, the physical cavity size should be minimized to the extent possible.

Use of a small resonator cavity would tend to avoid undesirable multimode resonance responses and to maximize achievable bandwidth in multipole filters without external coupling elements. Heretofore, the minimum resonator cavity size has been dictated by the size of the coupling transducer or transducers which must fit into the cavity.

SUMMARY OF THE INVENTION

In accordance with the present invention, it is proposed to provide an acoustic surface wave resonator device employing two reflecting grating structures on a piezoelectric substrate or a piezoelectric film disposed on a non-piezoelectric substrate, wherein at least one acoustic surface wave transducer is incorporated into the grating structures. The grating structures are positioned at opposite ends of the substrate and extend toward the substrate center having a fixed distance between the two structures, with at least one acoustic surface wave transducer being imposed on a portion of each of the two reflective grating structures in the center of the substrate. Such a transducer becomes an extension of the reflecting arrays. As envisioned herein, the resonant cavity is defined by the spacing between two transducers each of which is incorporated in a grating structure or by the space between one such incorporated transducer and a second array or by a space within a single transducer which is incorporated into both grating arrays. Preferably, the transducer is of the interdigital type. The grating structures may be formed in various ways, one approach involving the deposition of a plurality of parallel narrow bars of thin film material, which may be either conductive or nonconductive with the bars being positioned so that the surface waves propagating in the piezoelectric material will be incident thereon in a direction transverse to the longitudinal extension of the bars. As a surface wave passes a given one of these bars, a certain proportion of its energy will be reflected. By providing equal spacing between successive bars of these respective grating structures the energy reflected from the various bars adds coherently at the appropriate frequency. Inclusion of the interdigital transducer within the reflecting grating structure adds to the reflection of the acoustic surface waves, rather than providing spurious reflections, heretofore tolerated for some applications or suppressed by the use of split electrode configured transducers. Such transducer inclusion also reduces cavity size, thereby maximizing the achievable bandwidth in the filters without use of external inductors. Heretofore, the resonant cavity had to be large enough to physically hold the interdigital transducers. In the proposed invention, the physical size of the cavity can be less than the total size of the interdigital transducers, a condition not obtainable with the standard resonator configuration. In the new configuration, the cavity can always be made small enough to assure single mode operation.

In another embodiment of the present invention, a pair of acoustic surface wave transducers are incorporated into the two spaced grating structures on the piezoelectric substrate or a piezoelectric film disposed on a non-piezoelectric substrate, wherein one of the transducers is an input transducer and the other is an output transducer. In this arrangement, the input and output interdigital transducers are perodically extensive with the reflective grating and separated by a gap sufficient to support standing wave resonance at a distinct frequency. Just as in resonator devices having interdigital transducers placed within the resonant cavity, the present invention may take the form of a multi-cavity device using either two transducers having internal resonant cavities disposed on the substrate between sets of reflective grating structures or using two interdigital transducers periodically extensive with the reflective structures but separated by a third reflective grating structure.

BRIEF DESCRIPTION OF THE DRAWINGS

FIG. 1 is a perspective view partially schematic in form and showing a one port surface wave resonator device comprising one embodiment in accordance with the present invention;

FIG. 2 is a perspective view similar to FIG. 1 but showing a two port surface wave resonator device comprising another embodiment in accordance with the present invention;

FIG. 3 is a plan view of a third embodiment showing a multi-cavity, acoustic surface wave resonator device using two interdigital transducers with internal cavities;

FIG. 4 is a plan view similar to FIG. 3, but showing a different type of multi-cavity acoustic surface wave resonator;

DETAILED DESCRIPTION OF THE PREFERRED EMBODIMENTS

Figure 5:
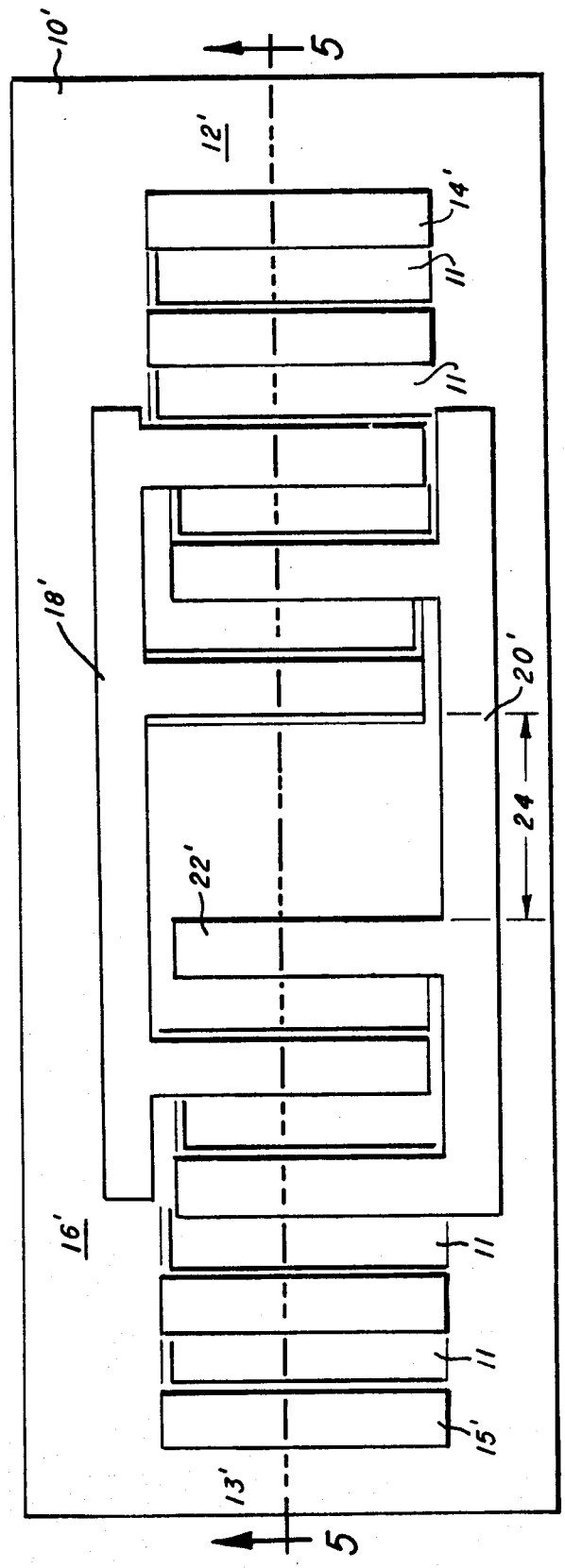
FIG. 5 is a perspective view similar to FIG. 1 but showing a reflector array comprising etched grooves.

Referring to FIG. 1, there is illustrated one embodiment of an acoustic surface wave resonator device in accordance with the present invention. The acoustic surface wave device comprises a substrate 10 of a suitable piezoelectric material, such a lithium niobate or quartz. First and second reflective grating structures 12,13 are provided on substrate 10. The reflective grating structures 12,13 comprise respective pluralities of discontinuities 14,15. The discontinuities 14,15 are formed at the surface of substrate 10 so as to be capable of reflecting at least a portion of any surface wave incident thereon.

The discontinuities 14,15 of the grating structures 12 and 13 may be formed as a plurality of narrow, thin film fingers or bars deposited on the surface of substrate 10. The bars may be formed of electrically conductive material such as gold, copper, or aluminum. Alternatively, they may be formed of a dielectric material such as silicon oxide, silicon nitride, and zinc oxide, for example. As a further alternative, the reflecting discontinuities 14 and 15 may be formed by selectively etching portions of the surface of the substrate 10. While for purposes of illustration, each of the reflecting grating structures 14, 15 is illustrated as having a small number of discontinuity elements, it will be understood that many more such elements may be incorporated into the grating structures, 400 being a typical number, to enhance the total percentage of reflection of acoustic surface waves incident to the grating structures 12 and 13.

The grating structures 12 and 13 are arranged on the substrate 10 in spaced apart, aligned relationship. An interdigital acoustic surface wave transducer 16 is disposed on the substrate 10 and incorporated into the reflective grating structures 12 and 13 as an extension of the same. The acoustic surface wave transducer 16 disposed on substrate 10 comprises electrode fingers 22 alternately originating from transducer pads 18 and 20, with said electrode fingers 22 being separated from the reflective grating structures 12 and 13 and from each other by respective distances equal to one-quarter the wavelength at resonant frequency. However, the center of the transducer 16 possesses a cavity 24 whereby the electrode fingers 22 defining the cavity 24 are separated by a distance which enables a standing wave resonance condition to occur at the resonant frequency.

The length of the cavity 24 is an integral number of half-wavelengths where the reflective grating structures 12 and 13 have a metal layer disposed thereon. Where the reflective grating structures 12 and 13 are non-metalic the cavity 24 is modified to compensate for changes in the wave velocity under said reflective grating structures so as to obtain a uniform reflection frequency in the device. It will be understood that the cavities described in the subsequent embodiments of the device are determined in the same manner as described for FIG. 1.

Although the drawings of FIGS. 1–4 show the transducer pads, 18 and 20 in FIG. 1, to be outwardly extending from both the reflective grating structures, 12 and 13 in FIG. 1, and the electrode fingers, 22 in FIG. 1, it will be understood that the discontinuities, 14 and 15 in FIG. 1, may extend to opposite ends of the substrate in spaced parallel relation to said transducer pads. The discontinuities, however, do have the limitation that they be substantially equal to or greater than the electrode fingers to assure proper surface wave reflection.

The extremities of substrate 10 may be suitably treated so as to effect the absorption of any surface waves incident thereon, thereby preventing reflection of surface waves extremities of substrate 10. Such treatment may comprise a deposition of an absorptive material at the surface of the substrate 10 in areas at the opposite ends thereof. In this respect, the end portions 26 and 28 of the substrate 10 define respective surface wave absorption areas.

Operationally, an external electrical energy source 30 excites the acoustic wave transducer 16 whereby that energy is converted to acoustic surface wave energy propagating along the surface of substrate 10. As these propagating surface waves reach the discontinuity elements 14 and 15 of the grating structures 12 and 13, they will be at least partially reflected by each of the discontinuity elements, and also partially reflected by the electrode fingers 22 of the transducer 16 which is a periodic extension of within the discontinuity elements 14,15. As a result, the waves reflected from the various discontinuity elements 14 and 15 of the respective gating structures 12,13 and the reflections from the electrode fingers 22 will reinforce in a coherent manner. If a suitable number of reflective discontinuities are provided, almost total reflection of the incident acoustic waveform will occur. The presence of the cavity 24 at the center of the transducer 16 which is effectively the spacing between the two reflective grating structures 12,13, including the transducer 16 as an extension thereof, results in a standing wave condition at a distinct frequency. The output of the device connected in series to similar devices will form a bandpass filter whose bandwidth is larger than normally obtainable due to reduction in resonant cavity size. A filter using acoustic surface wave devices in accordance with the present invention will support a single resonant mode, eliminate spurious reflections from interdigital transducers, using the transducer for positive reinforcement of wave reflection, and reduce diffraction losses in the cavity in resonator structures where the reflector structure contains and guides the surface wave.

FIG. 2 illustrates another embodiment of the invention in the form of a two port resonator structure formed on a substrate of piezoelectric material 50. The resonator device of FIG. 2 includes first and second reflective grating structures 52 and 53 disposed on the substrate 50, the reflective grating structure 52,53 comprising respective pluralities of discontinuities 54,55. The discontinuities 54,55 are formed at the surface of substrate 50 so as to be capable of reflecting at least a portion of any surface waves incident thereon.

The discontinuities 54 and 55 of the grating structures 52 and 53 may be formed as previously described in connection with the embodiment of FIG. 1. The grating structures 52 and 53 are arranged on the substrate 50 in spaced apart, aligned relationship. Input and output acoustic surface wave transducers 56 and 57 are disposed on the substrate 50 and incorporated into respective grating structures 52, and 53, becoming extensions thereof. The input and output transducers 56 and 57 are preferably of the interdigitated typ comprising electrode fingers 58 and 59 extending from their respective transducer pads 60, 61 and 62,63. Although each of the transducers 56 and 57 is shown as having two sets of alternating electrode fingers 58 and 59 respectively, it will be understood that the transducers 56 and 57 may have a larger number of electrode fingers, a configuration made possible by not having the transducers in the resonant cavity but rather incorporated into the reflective grating structures 52 and 53. The reflective grating structures 52,53 and their extensions, in the form of the acoustic surface wave transducers 56 and 57, are separated by a cavity 70 of predetermined size, enabling a standing wave resonance condition at a distinct resonant frequency. The input interdigital transducer 56 is coupled by means of lines 64 and 65 to an input electrical excitation source 66. Thus, electrical energy from the excitation source 66 is converted by the input interdigital transducer 56 to acoustic surface wave energy propagating along the surface of substrate 50. As these propagating surface waves reach the discontinuity elements 54 and 55, they will be at least partially reflected by each of the discontinuity elements as well as by the electrode fingers 58 and 59 of the input and output interdigital transducers 56 and 57. If a suitable number of reflected discontinuities are provided, almost total reflection of the incident acoustic waveform will occur. The presence of the two reflective grating structures 52,53 and the interdigital transducers 56,57 disposed on the surface of substrate 50 results in a standing wave resonant condition being set up between the two reflectors 52,53 and their transducer extensions. Energy is coupled out of the device by way of the output interdigital transducer 57 which is connected in series with a similar acoustic surface wave device (SWD), 71, forming a bandpass filter having the characteristics described above for the one port resonator device.

FIG. 3 illustrates a multiple cavity resonator device in accordance with the present invention. In the embodiment of FIG. 3, two acoustic surface wave interdigital transducers, 120 and 130, are disposed at opposite ends of a piezoelectric substrate 100, being periodically extensive with reflective grating structures 140, 150 and 160. The reflective grating structures 140, 150 and 160 comprise respective pluralities of discontinuities 141, 151, and 161, spaced one-half the wavelength at resonant frequency. The interdigital transducers 120 and 130 comprise a plurality of electrode fingers 121 and 131, alternately originating from their respective transducer pads 122 and 132. The electrode fingers 121 and 131 are longitudinally aligned and periodic with the discontinuity elements 141, 151 and 161. However, in the interdigital transducers 120 and 130 there exists a spacing defined by the electrode fingers 121 and 131 whereby the distance between electrode fingers at the center of both interdigital transducers 120 and 130 is such that resonant cavities 123 and 133 are formed to support a standing wave resonance condition.

An alternative multiple cavity resonator device in accordance with the present invention is illustrated in FIG. 4. In the embodiment of FIG. 4, two acoustic surface wave interdigital transducers 220 and 230 are disposed at opposite ends of a piezoelectric substrate 200, being periodicaly extensive with reflective grating structures 240 and 260, respectively. The reflective grating structures 240 and 260 comprise a plurality of discontinuities 241 and 261 spaced one-half the wavelength at resonant frequency. The interdigital transducers 220 and 230 comprise a plurality of electrode fingers 221 and 231 alternately originating from their respective transducer pads 222 and 232. The electrode fingers 221 and 231 are longitudinally aligned and periodic with discontinuity elements 241 and 261 being equally spaced throughout the respective interdigital transducers 220 and 230. Acoustic surface wave transducers 220 and 230 are further spaced a predetermined distance from a third reflective grating structure 250, thereby defining resonant cavities 225 and 235 which are capable of supporting standing wave resonance conditions.

The resonator devices as set forth in embodiments demonstrated by FIGS. 3 and 4 possess similar characteristics of the one and two port resonator devices described and illustrated in FIGS. 1 and 2, respectively. The major advantages over multicavity devices heretofore known are the elimination of longitudinal resonances and spurious reflections from interdigital transducers in the cavity, the possible use in filters with larger bandwidth specifications, and the reduction of diffraction losses in the cavity in resonator structures where the reflector structure contains and guides the surface waves.

Operationally, the embodiments illustrated in FIGS. 3 and 4 are energized by way of external excitation sources providing electrical energy which is to be converted by the input acoustic surface wave interdigital transducers to acoustic energy propagating along the respective substrates. Energy is coupled out of the devices described in FIGS. 3 and 4 by way of a connection to a similar transducer in a comparable device serially connected to create a bandpass filter.

FIG. 5 is a perspective view of a further embodiment of the invention using etched grooves 11 to form reflecting structures 12' and 13' along the substrate 10'. The resonator device of FIG. 5 is otherwise identical to the embodiment shown in FIG. 1. Therefore, to avoid repetitious description, corresponding structural elements in FIG. 5 have been designed by the same reference numerals employed in connection with the embodiment of FIG. 1 with the prime notation added.

Figure 6:
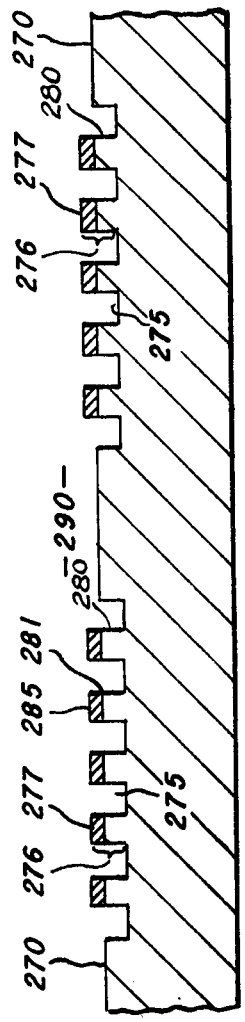
FIG. 6 is a longitudinal cross-sectional view of FIG. 5 taken along line 5.5.
Figure 7:
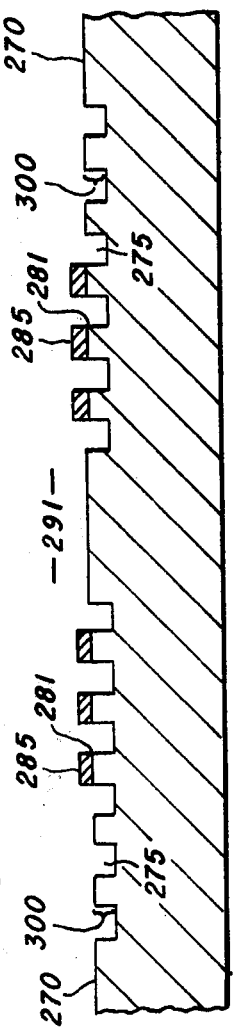
FIG. 7 is a longitudinal sectional view of FIG. 5 taken along line 5.5 showing a further embodiment in accordance with the present invention.

FIG. 6 and FIG. 7 are cross-sectional views illustrating the use of etched grooves 275 to form discontinuities 276 along the substrate 270. In the embodiment of FIG. 6 a metal layer 277 is disposed on a series of ridges 280 which are located between said grooves 275 forming discontinuities 276. The transducer electrode finger 285 is likewise disposed on a separate series of ridges 281, thus adding to the reflection of the acoustic surface wave. The internal cavity 290 between transducer electrode fingers 285 is equal to an integral number of half-wavelengths at resonant frequency. However, in a further embodiment illustrated in FIG. 7, where the discontinuities 300 do not include a ridge having a metal layer, the cavity 291 is modified to compensate for the change in wave velocity under the discontinuities so as to assure a standing wave resonance condition.

While particular embodiments of a resonator device have been disclosed and described, it will be understood that various modifications, changes, substitutions and alterations may be made therein without departing from the spirit and scope of the invention which is defined by the appended claims.

What is claimed is:

1. An acoustic surface wave resonator device comprising:
    substrate means having at least a surface layer of piezoelectric material on which acoustic surface waves may be propagated,
    reflecting means defined on the piezoelectric surface of said substrate means for reflecting acoustic surface waves propagating thereon, said reflecting means including a plurality of discontinuity elements having a predetermined spacing therebetween, and
    acoustic surface wave interdigital transducer means interacting with said reflecting means and having a plurality of electrodes disposed on said substrate means so as to be periodically extensive with said discontinuity elements and separated from said discontinuity elements by said predetermined spacing.

2. A resonator device as set forth in claim 1, wherein said substrate means comprises a substrate made entirely of piezoelectric material.

3. A resonator device as set forth in claim 1, wherein said substrate means comprises a substrate body of non-piezoelectric material having a surface of piezoelectric material on which said acoustic surface wave transducer means and said reflecting means are disposed.

4. A resonator device as set forth in claim 1, wherein said reflecting means comprises a pair of reflective grating surfaces formed at the surface of said substrate means.

5. A resonator device as set forth in claim 4, wherein the plurality of discontinuity elements of each of said pair of reflective grating structures are spaced from center to center one-half wavelength apart at the resonant frequency, whereby a standing wave condition occurs at resonance.

6. An acoustic surface wave resonator device comprising:
    substrate means having at least a surface layer of piezoelectric material on which acoustic surface waves may be propagated,
    reflecting means defined on the piezoelectric surface of said substrate means for reflecting acoustic surface waves propagating thereon, said reflecting means including a plurality of discontinuity elements with a predetermined spacing therebetween defining a cavity enabling a standing wave condition at resonance, said reflecting means comprising a pair of reflective grating structures formed at the surface of said substrate means with said plurality of discontinuity elements spaced from center to center one-half wavelength apart at the resonant frequency, and
    acoustic surface wave interdigital transducer means having at least one interdigital transducer periodically extensive with said discontinuity elements, said interdigital transducer including respective sets of opposed conductive transducer pads, and a plurality of electrode fingers alternately originating from one and the other of the sets of conductive transducer pads, with said electrode fingers spaced $\lambda/4$ apart, where $\lambda$ is the wavelength at the resonant frequency, except at the interdigital transducer center where the electrode finger spacing is sufficiently greater than $\lambda/4$ to form a resonant cavity for standing wave resonance.

7. A resonator device as set forth in claim 6, wherein said plurality of discontinuity elements are at least equal in length to said electrode fingers.

8. A resonator device as set forth in claim 6, wherein said discontinuity elements have a metallic layer disposed thereon, and said resonant cavity is equal to an integral number of half-wavelengths at the resonant frequency.

9. A resonator device as set forth in claim 6, wherein said discontinuity elements have a non-metallic surface, and said resonant cavity is modified to compensate for the resultant change in wave velocity under said discontinuity elements to obtain the desired standing wave resonance condition.

10. An acoustic surface wave resonator device comprising:
   substrate means having at least a surface layer of piezoelectric material, on which acoustic surface waves may be propagated,
   first and second means disposed on said piezoelectric surface of said substrate means for reflecting acoustic surface waves propagating thereon, each of said first and second means having a plurality of discontinuity elements, where said discontinuity elements have a predetermined spacing, and
   input and output interdigital acoustic surface wave transducers for electric to acoustic energy conversion at the input transducer interacting with said first means and acoustic to electric energy conversion at the output transducer interacting with said second means, said input interdigital transducer being periodically extensive with said plurality of discontinuity elements of said first means and separated therefrom by said predetermined spacing and said output interdigital transducer being periodically extensive with said plurality of discontinuity elements of said second means and separated therefrom by said predetermined spacing, said input and output interdigital transducers being disposed a predetermined distance apart to define the cavity for supporting a standing wave at resonant frequency, and said input and output interdigital transducers having opposed sets of conductive transducer pads, and a plurality of electrode fingers alternately originating from one and the other of the sets of conductive transducer pads.

11. A resonator device as set forth in claim 10, wherein said first and second means comprise reflecting grating structures disposed at the surface of said substrate means.

12. A resonator device as set forth in claim 11, wherein the plurality of discontinuity elements of each of said reflective grating structures are spaced from center to center one-half wavelength apart at the resonant frequency, whereby a standing wave condition occurs at resonance.

13. A resonator device as set forth in claim 12, wherein said plurality of discontinuities are at least equal in length to said electrode fingers.

14. A resonator device as set forth in claim 10, wherein said discontinuity elements have a metallic layer disposed thereon, and said resonant cavity is equal to an integral number of half-wavelengths at the resonant frequency.

15. A resonator device as set forth in claim 10, wherein said discontinuity elements have a non-metallic surface, and said resonant cavity is modified to compensate for the resultant change in wave velocity under said discontinuity elements to obtain the desired standing wave resonance condition.

16. A resonator device as set forth in claim 13, wherein a third reflective grating structure is disposed on said substrate means a sufficient distance from each of said input and output interdigital transducers to define two distinct resonant cavities therebetween to support a standing wave resonance condition.

17. An acoustic surface wave resonator device comprising:
   substrate means having at least a surface layer of piezoelectric material on which acoustic surface waves may be propagated,
   reflecting means defined on the piezoelectric surface of said substrate means for reflecting acoustic surface waves propagating thereon, said reflecting means comprising a pair of reflective grating structures formed at the surface of said substrate means and including a plurality of discontinuity elements with a predetermined spacing therebetween defining a cavity enabling a standing wave condition at resonance, said plurality of discontinuity elements spaced from center to center one-half wavelength apart at the resonant frequency, and
   acoustic surface wave interdigital transducer means comprising an input and output interdigital transducer periodically extensive with said reflective grating structures, said input and output interdigital transducers including opposed conductive transducer pads having electrode fingers alternately originating therefrom and spaced $\lambda/4$ apart, where $\lambda$ is the wavelength at resonant frequency, except at the transducer center where the electrode finger spacing is sufficiently greater than $\lambda/4$ to form a resonant cavity for standing wave resonance.

18. An acoustic surface wave resonator device comprising:
   substrate means having at least a surface layer of piezoelectric material on which acoustic surface waves may be propagated,
   reflecting means defined on the piezoelectric surface of said substrate means for reflecting acoustic surface waves propagating thereon, said reflecting means including a plurality of discontinuity elements with a predetermined spaced therebetween defining a cavity enabling a standing wave condition at resonance, and
   acoustic surface wave interdigital transducer means having at least one interdigital transducer periodically extensive with said discontinuity elements, said interdigital transducer including respective sets of opposed conductive transducer pads, and a plurality of electrode fingers alternately originating from one and the other of the sets of conductive transducer pads, with said electrode fingers spaced $\lambda/4$ apart, where $\lambda$ is the wavelength at the resonant frequency, except at the interdigital transducer center where the electrode finger spacing is sufficiently greater than $\lambda/4$ to form a resonant cavity for standing wave resonance.

19. A resonator device as set forth in claim 18, wherein said plurality of discontinuity elements are at least equal in length to said electrode fingers.

20. A resonator device as set forth in claim 18, wherein said discontinuity elements have a metallic layer disposed thereon, and said resonant cavity is equal to an integral number of half wavelengths at the resonant frequency.

21. A resonator device as set forth in claim 18, wherein said discontinuity elements have a non-metallic surface, and said resonant cavity is modified to compensate for the resultant change in wave velocity under said discontinuity elements to obtain the desired standing wave resonance condition.

22. An acoustic surface wave resonator device comprising:

substrate means having at least a surface layer of piezoelectric material, on which acoustic surface waves may be propagated, reflecting means defined on the piezoelectric surface of said substrate means for reflecting acoustic surface waves propagating thereon, said reflecting means including a plurality of discontinuity elements with a predetermined spacing therebetween defining a cavity enabling a standing wave condition at resonance, and acoustic surface wave interdigital transducer means comprising an input and output interdigital transducer periodically extensive with said discontinuity elements, said input and output interdigital transducers including opposed conductive transducer pads having electrode fingers alternately originating therefrom and spaced $\lambda/4$ apart, where $\lambda$ is the wavelength at resonant frequency, except at the transducer center where the electrode finger spacing is sufficiently greater than $\lambda/4$ to form a resonant cavity for standing wave resonance.

* * * * *